United States Patent [19]

Neumann

[11] 4,024,533
[45] May 17, 1977

[54] RATIOMETRIC ANALOG-TO-DIGITAL CONVERTER

[75] Inventor: Leopold Neumann, Lexington, Mass.

[73] Assignee: Analogic Corporation, Wakefield, Mass.

[22] Filed: July 10, 1975

[21] Appl. No.: 594,758

[52] U.S. Cl. .................. 340/347 NT; 340/347 AD
[51] Int. Cl.² ....................................... H03K 13/20
[58] Field of Search ............. 340/347 AD, 347 NT

[56] References Cited
UNITED STATES PATENTS

| | | | |
|---|---|---|---|
| 3,749,894 | 7/1973 | Avdeef | 340/347 NT |
| 3,909,824 | 9/1975 | Fontanes | 340/347 NT |

Primary Examiner—Charles D. Miller
Attorney, Agent, or Firm—Weingarten, Maxham & Schurgin

[57] ABSTRACT

An analog-to-digitial converter of the dual slope type wherein simultaneous integration of two input signals is achieved to provide a digital output substantially immune to disturbances affecting both signals. First and second dual slope converter circuits are employed, each receiving a respective analog signal. During conversion of the first signal, integration of the second signal is accomplished such that a digital output signal is provided representing the integrated instantaneous ratio of the two input signals and which is substantially free of disturbances affectng both of signals which may be introduced during a conversion cycle.

13 Claims, 5 Drawing Figures

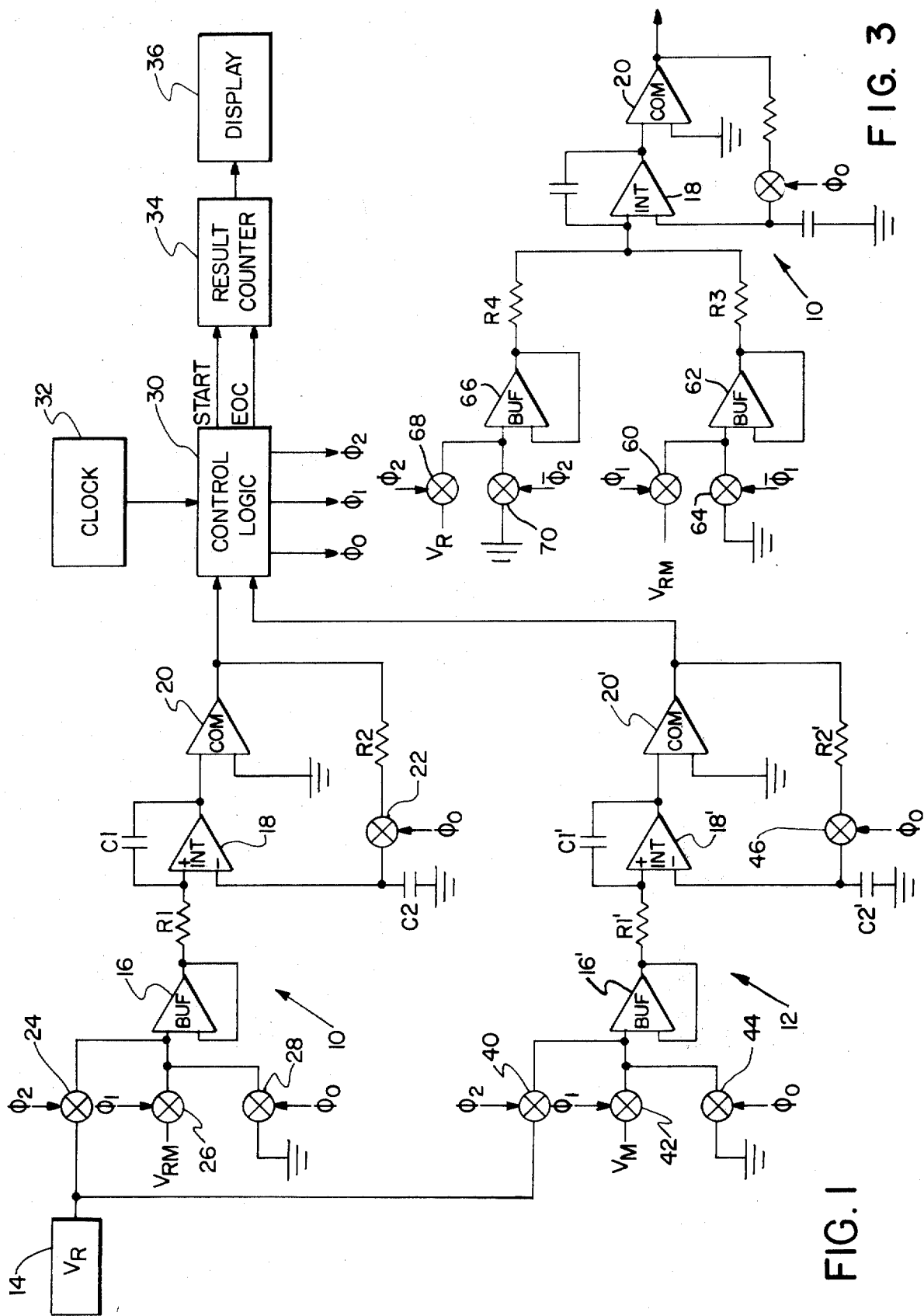

4,024,533

RATIOMETRIC ANALOG-TO-DIGITAL CONVERTER

FIELD OF THE INVENTION

This invention relates to analog-to-digital converters generally, and in particular to precision ratiometric analog-to-digital converters.

BACKGROUND OF THE INVENTION

According to the ratiometric dual slope analog-to-digital conversion technique known to the art, the level of an unknown analog signal is measured by integration thereof over a precise time interval. Upon completion of this measurement integration cycle, the resultant value is integrated with respect to a sensed external reference value of a polarity which causes the resultant value to decrease at a constant rate. The interval of time required for the resultant value to return to zero or its value prior to the measurement integration cycle is measured by appropriate counter and clock means to provide a digital indication of the analog input value. According to this conversion technique, the measurement integration cycle and the reference integration cycle occur sequentially and is susceptible to non-periodic and short term noise.

SUMMARY OF THE INVENTION

According to the invention, an analog-to-digital converter is provided which is capable of the simultaneous integration and conversion of two analog input signals and to produce as an output a digital representation of the ratio of the integral of the two analog input signals. The novel converter exhibits substantial immunity to disturbances that affect both signals. First and second dual slope converter circuits are employed each receiving a respective analog input signal. The two converters are arranged so that the two converters simultaneously integrate their respective input signals and such that the magnitude of one of the integrated signals controls the duration of the integration time so that a digital output signal is provided representing the ratio of the simultaneous integral of the two input signals. The invention is particularly useful in comparing a mass of unknown weight with a mass of known weight as, for example, in a digital electronic weighing system. It will be appreciated, however, that the invention is more broadly useful to provide digital conversion of first and second analog input signals derived from various sources.

DESCRIPTION OF THE DRAWINGS

The invention will be more fully understood by reference to the following detailed description taken in conjunction with the accompanying drawings in which:

FIG. 1 is a schematic diagram of a preferred embodiment of the invention;

FIG. 3 is a schematic diagram of an alternative embodiment of the invention.

DETAILED DESCRIPTION OF THE INVENTION

Figure 2A:
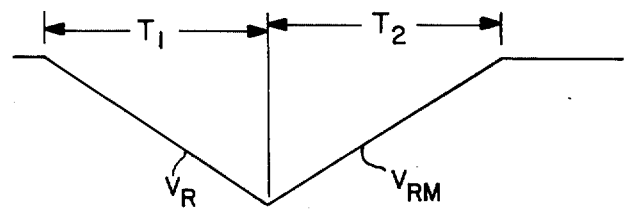
FIGS. 2A, 2B and 2C are waveforms useful in illustrating operation of the invention.

The invention will be described in the context of an electronic weighing system for the purpose of processing a first analog input signal derived from a reference mass and a second analog input signal derived from an unknown mass, the weight of which is to be measured.

The novel converter is shown schematically in FIG. 1 and includes first and second circuit portions 10 and 12 which in this embodiment are identical and which are respectively operative in response to a voltage $V_{RM}$ derived from a reference mass and a voltage $V_M$ derived from an unknown mass. Each circuit portion is also operative in response to a reference voltage $V_R$ derived from a suitable internal reference source 14. Circuit portion 10 includes a dual slope converter comprising a buffer amplifier 16 coupled via a resistor R1 to an integrator 18 which in turn is coupled to a comparator 20. A capacitor C1 is coupled from the output to the input of the operational amplifier defining integrator 18.

The output of comparator 20 is coupled via a resistor R2 and an electronically controlled switch 22 to the negative input of integrator 18. A capacitor C2 is connected from the negative input of integrator 18 to ground. Input switches 24, 26 and 28 are provided for respective coupling of buffer amplifier 16 to input voltages $V_R$, $V_{RM}$ and ground. The switches 22 through 28 are typically CMOS or other solid state switches controllable in response to an applied signal to provide conductive and nonconductive switching states. Control signals $\phi_0$, $\phi_1$ and $\phi_2$ for these switches are provided by control logic 30 operative in response to a system clock 32 to provide intended switch control signals in predetermined timed manner. The logic is itself of well known implementation and need not be shown in any detail for purposes of this invention. Logic 30 is coupled to a result counter 34 which in turn is coupled to display 36 or other output means.

Circuit portion 12 is identical to circuit portion 10 and includes input switches 40, 42 and 44 coupled respectively to voltages $V_R$, $V_M$ and ground. These input switches are coupled to a dual slope converter which includes buffer 16', integrator 18' and comparator 20'. A switch 46 is provided in the feedback path from the output of comparator 20' to the input of integrator 18'. The output of comparator 20' is also coupled to control logic 30, and the switches 40 through 46 are controlled by appropriate control signals provided by logic 30.

The operation of the embodiment of FIG. 1 will be described with reference to the waveforms of FIGS. 2A and 2B. An autozero period $T_0$ is initially provided to permit self-adjustment of the circuit for internal errors to effectively provide an initial zero or reference condition after which the measurement cycle commences. During time interval $T_0$, control signal $\phi_0$ causes switches 28, 22, 44 and 46 to be closed to provide an autozero reference to the dual slop converters, the reference voltage being stored by capacitors C2 and C2' of respective integrators 18 and 18'. During the interval $T_1$ (FIG. 2A), switch 24 is closed by signal $\phi_2$ to provide the reference signal $V_R$ to buffer 16. The period $T_1$ is defined by a predetermined number of clock pulses from system clock 32, and at the end of this interval, switch 24 is opened and switch 26 is closed by signal $\phi_1$, to provide during period $T_2$ the voltage $V_{RM}$ to buffer 16 and thence to integrator 18. The integrator output signal returns from the reference level to the zero state during the time interval T2, defined as the time required for return of the integrated output signal to the reference. Thus, the time period $T_2$ will vary with the value of the reference mass signal. At the end of interval $T_2$, switch 26 is opened and switch 28 closed to again provide an autozero mode for circuit portion 10.

During interval $T_2$, switch 42 is also closed, causing application of measured mass signal $V_M$ to buffer 16'. The integrator 18' provides an integrated signal, shown in FIG. 2B, which at the end of interval $T_2$ reaches a level in accordance with the value of the signal $V_M$. After a short reclocking interval, since the time period $T_2$ is not synchronous with the system clock, the switch 40 is closed to provide integration of reference signal $V_R$ to cause return of the output signal of integrator 18' to its reference level. During interval $T_3$, the system clock 32 is gated by logic 30 into the result counter 34 which stores the digitized representation of the analog input signal. This digitized result can then be applied to display 36 for visual indication of the measured value or applied to other appropriate utilization means as desired. After interval $T_3$, circuit portion 12 is again returned to an autozero mode.

The duration of period $T_2$ may be expressed in terms of the following equations:

$$V_R T_1 = V_{RM} T_2$$

$$V_R N_1 T_{CP} = V_{RM} T_2$$

$$T_2 = V_R/V_{RM}(N_1 T_{CP})$$

where $V_R$, $V_{RM}$, $T_1$ and $T_2$ are as described above, $T_{CP}$ is the clock duration and $N_1$ is a scaling constant and is the number of clock pulse counts during $T_1$. In the illustrated embodiment, the period $T_2$ has a nominal value of 200 milliseconds, which may vary typically by ±0.15% with the value of the reference mass signal.

Figure 2B:
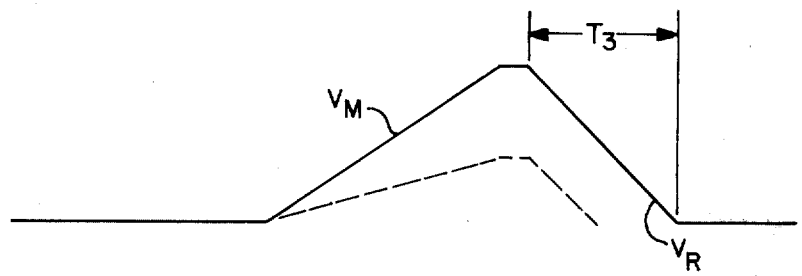

As shown in FIG. 2B, integration by circuit portion 12 of a signal is derived from the measured mass $V_M$ for the time interval $T_2$, previously defined by the integration time of the reference mass $V_{RM}$ generated by the circuit portion 10. At the end of interval $T_2$, there occurs a short reclocking interval permitting the system clock 16 to recycle. Thereupon, circuit portion 12 integrates during a period $T_3$ the internal reference $(V_R)$ until the output of the integrator 24 has returned to its reference level. The length of the interval $T_3$ is measured by the system clock 16 which is gated to the result counter 18 which is operative to store a result $(N_3)$ representing the converted analog input value. The digitized output value $N_3$ may be defined by the equations:

$$V_M T_2 = V_R T_3$$

$$V_M T_2 = N_3 T_{CP} V_R$$

$$N_3 = )V_M T_2) / (T_{CP} T_R)$$

Substituting the equation for $T_2$ as hereinabove, then $$N_3 = V_M/V_{RM} N_1$$

It will be appreciated that the resulting equation for $N_3$ is independent of parameters which may cause errors due to parameter drift. Circuit portions 10 and 12 of the present invention may each be implemented by a modular unit such as an AN2344 analog-to-digital converter manufactured by Analogic Corporation. The aforementioned converter has incorporated therein circuitry for providing an autozeroing cycle occurring between measurement cycles during which all errors of the buffer amplifier, integrator and comparator are stored and employed for correction during the actual measurement.

Figure 2C:
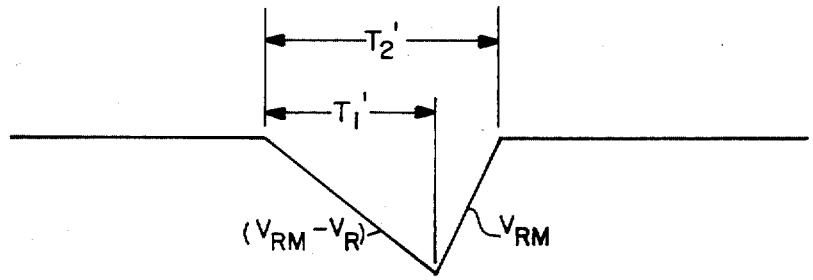

The measurement cycle of the present invention is typically 600 milliseconds overall, with each timing interval typically being 200 milliseconds. By utilizing an alternative embodiment of first circuit portion 10, shown in FIG. 3, the measurement cycle can be further shortened. The embodiment of FIG. 3 differs from that in FIG. 1 in that timing interval $T_1$ overlaps timing interval $T_2$ as shown in the plot of FIG. 2C. In the alternative embodiment, the first circuit portion 10 is provided with an alternative input to integrator 18. A signal representative of the reference mass $V_{RM}$ is provided at an input to a switch 60 operative in response to a signal $\phi_1$ from control logic 30 (FIG. 1), and coupled to a first input buffer amplifier 62. A switch 64, operative in response to the complement $\bar{\phi}_1$ of the signal to switch 60 couples the input of buffer amplifier 62 to ground as part of the autozeroing circuitry. A voltage reference $V_R$ supplied by the voltage reference supply 14 (FIG. 1) is coupled to a reference buffer amplifier 66 through a switch 68, operative in response to a control signal $\bar{\phi}_2$ from logic control 30. A switch 70, operative in response to complementary control signal $\phi_2$ from logic control 30, provides coupling between the input of reference buffer amplifier 66 and ground. The output of each of the buffer amplifier 62 and 66 are coupled through respective matched resistors R3 and R4 to the input of integrator 18.

Referring now to FIG. 2C, there is shown a timing interval $T_1'$, and an overlapping timing interval $T_2'$ on a plot representative of the output waveform of integrator 18. During interval $T_1'$, which is shorter than interval $T_2'$, and of predetermined length, both switches 60 and 68 are closed. Thus, the integrated value during period $T_1'$ represents the difference between the value representing the reference mass and the reference voltages. At the end of interval $T_1'$, switch 68 is opened and switch 70 is closed so that the resultant integrated value represents the value of the reference mass only. The timing interval is terminated as before upon indication from comparator 20 that the zero reference has been encountered.

It should be evident that the invention provides the efficient production of a digital output signal representing the simultaneous ratio of first and second analog input signals. Where one of the input signals is a reference signal, as in the embodiments described above, the output signal is representative of the value of the analog input with respect to this reference signal. Processing of both input signals is achieved during an overlapping time interval such that the overall measurement time is relatively short. Moreover, the output signal is substantially immune to disturbances which affect both signals and which may occur during the measurement cycle.

The invention is not limited to only a dual slope converter, but can be employed with other conversion circuits providing a time interval representative of an analog signal. For example, circuit 10 can be a single ramp converter while circuit 12 can be a dual slope converter. Or voltage to frequency converter circuits can be employed with a counter to control the time base and provide the resultant output.

It will also be appreciated that the actual implementation of the invention may vary to suit specific operational requirements. Accordingly, it is not intended to limit the invention by what has been particularly shown and described except as indicated in the appended claims.

What is claimed is:

1. An analog-to-digital converter comprising:
   a first analog signal to time interval converter circuit operative during a first time interval to provide a signal representative of the magnitude of a reference signal and operative during a second time interval to provide a signal of a duration representative of the value of a first input signal;
   a second analog signal to time interval converter circuit operative during said second time interval to provide a signal representative of the value of a second input signal and operative during a third time interval to provide a time interval of a duration representative of the ratio of said first and second input signals.

2. The invention according to claim 1 wherein at least one of said first and second converter circuits is operative in response to an input signal to provide an integrated signal representative of the magnitude of the input signal.

3. The invention according to claim 2 wherein each of said first and second converter circuits is a dual slope converter circuit.

4. The invention according to claim 3 further including counter means operative during said third time interval to provide an output count representative of the ratio of said first and second input signals.

5. The invention according to claim 4 further including means associated with said first and second dual slope converter circuits providing an autozero cycle at the commencement of the measurement cycle of each of said circuits.

6. The invention according to claim 4 wherein said counter means includes:
   a clock providing clock at predetermined frequency; and
   a counter operative to store a count representative of the number of clock pulses during said third time interval.

7. The invention according to claim 3 wherein said first and second dual slope converter circuits each include switch means operative to provide said time intervals.

8. The invention according to claim 1 wherein said first analog signal to time converter circuit includes:
   a first circuit portion operative during a first time interval to provide a signal representative of the difference between a reference signal and a first input signal; and
   a second circuit portion operative during a second time interval overlapping said first time interval to provide a signal of a duration representative of the value of said first input signal.

9. An analog-to-digital converter for providing a digital representation of the ratio of first and second analog signals, comprising:
   a first analog signal to time interval converter, including a first integrator;
   a second analog signal to time interval converter, including a second integrator;
   a reference signal source;
   means for applying the reference signal to the first integrator for a first fixed interval of time;
   means for applying the first analog input signal to the first integrator and for applying the second analog input signal to the second integrator during a second interval;
   the duration of the second interval being determined such that the time integral of the first analog input signal during the second interval is equal to the magnitude of the time integral of the reference signal during the first interval;
   means for applying the reference signal to the second integrator during a third interval;
   the duration of the third interval being determined such that the time integral of the reference signal during the third interval is equal to the magnitude of the time integral of the second analog input signal during the second interval; and
   means for providing an output representation of the ratio of the third interval to the interval to provide a representation of the ratio of the first and second analog input signals.

10. The converter of claim 9 wherein the second interval begins immediately after the end of the first interval.

11. The converter of claim 9 wherein the first and second intervals overlap.

12. The converter of claim 11 wherein the first and second intervals begin at the same time.

13. The converter of claim 9 further including:
   means for determining the end of the second interval by sensing when the output of the first integrator has returned to the level at which it was prior to the beginning of the first interval; and
   means for determining the end of the third interval by sensing when the output of the second integrator has returned to the level at which it was prior to the beginning of the second interval; and
   wherein the reference signal is of a polarity such that applying the reference signal to the first and second integrators produces integrator outputs therefrom having time derivatives of opposite slopes than results from the respective application of the first and second analog input signals to the first and second integrators.

* * * * *